(12) United States Patent
Beroz et al.

(10) Patent No.: US 7,361,979 B2
(45) Date of Patent: Apr. 22, 2008

(54) MULTI-SHEET CONDUCTIVE SUBSTRATES FOR MICROELECTRONIC DEVICES AND METHODS FOR FORMING SUCH SUBSTRATES

(75) Inventors: Masud Beroz, Livermore, CA (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 280 days.

(21) Appl. No.: 11/025,401

(22) Filed: Dec. 29, 2004

(65) Prior Publication Data
US 2006/0138640 A1    Jun. 29, 2006

(51) Int. Cl.
*H01L 23/02* (2006.01)
*H05K 1/00* (2006.01)

(52) U.S. Cl. .............................. 257/678; 257/E23.141; 361/748

(58) Field of Classification Search .............. 257/666, 257/668, 676, 678, 680, 701; 438/109; 361/748, 361/749, 750, 751
See application file for complete search history.

(56) References Cited

U.S. PATENT DOCUMENTS

| | | | |
|---|---|---|---|
| 6,313,522 B1 * | 11/2001 | Akram et al. ............... | 257/686 |
| 6,372,620 B1 | 4/2002 | Oosawa et al. | |
| 6,528,874 B1 | 3/2003 | Iijima et al. | |
| 6,617,236 B2 | 9/2003 | Oosawa | |
| 6,625,032 B1 * | 9/2003 | Ito et al. ..................... | 361/751 |
| 6,646,337 B2 | 11/2003 | Iijima et al. | |
| 2002/0140076 A1 | 10/2002 | Yamazaki et al. | |

OTHER PUBLICATIONS

Haba et al., U.S. Appl. No. 10/917,978, filed Aug. 13, 2004.
Humpston et al., U.S. Appl. No. 10/949,674, filed Sep. 24, 2004.

\* cited by examiner

*Primary Examiner*—Scott B. Geyer
(74) *Attorney, Agent, or Firm*—Lerner, David, Littenberg, Krumholz & Mentlik, LLP

(57) ABSTRACT

A substrate is provided having a plurality of sheets. Each sheet has a first major surface containing a plurality of electrically conductive regions and a second major surface that opposes the first major surface. The sheets are arranged such that the first major surface of a sheet faces the second major surface of another. At least one electrically conductive region of each sheet is partially or fully exposed. At least one electrically conductive region of a sheet is partially or fully covered, e.g., by one or more electrically conductive regions of another sheet. A method for forming such a substrate is also provided.

24 Claims, 4 Drawing Sheets

MULTI-SHEET CONDUCTIVE SUBSTRATES FOR MICROELECTRONIC DEVICES AND METHODS FOR FORMING SUCH SUBSTRATES

BACKGROUND OF THE INVENTION

The present invention relates generally to multi-sheet conductive substrates for microelectronic devices. In particular, the invention relates to substrates formed from a plurality of sheets each having electrically conductive regions, wherein at least one sheet has both exposed and covered electrically conductive regions. Also provided are methods for forming multi-sheet conductive substrates.

To increase the portability of electronic products, there is an ongoing effort to miniaturize integrated circuits, processors, and other microelectronic devices such as semiconductor chips. Similarly, as there is a need to increase functionalities of such microelectronic devices, there is an ongoing effort to increase the number of input and output connections in microelectronic devices to other electronic components. As the number of interconnections per microelectronic device increases and the size of microelectronic devices decrease, the number of contacts per unit surface area of such devices increases. In addition, microelectronic devices are increasingly packaged in chip-scale and multi-chip packages to facilitate testing and connection to other electronic components of the electronic products. Such packages often employ prefabricated arrays or rows of leads/discrete wires, solder bumps or combinations of both on a substrate. In short, finer contact pitches are required to keep up with the demand for improved microelectronic devices and their corresponding packages.

Advances in microelectronic devices packaging have been accompanied by corresponding advances in the materials and technologies for use as package substrates. For example, early microelectronic devices have been packaged using metal leadframe substrates. Such substrates are generally well suited for lead counts of about 8 to about 48 contacts having a pitch of about 1.78 to about 2.54 mm. Later, rigid laminate substrates have been used to package microelectronic devices. Such substrates may include two to four alternating layers fiberglass and epoxy, wherein successive fiberglass layers may be laid in traversing, e.g., orthogonal, directions. When ball grid array (BGA) formats are used, microelectronic device packaging may have about 144 to about 900 contacts having pitch comparable or finer than the pitch associated with lead frame technologies.

Recently, tape BGA packing formats have been introduced to provide a thinner packaging solution. Such tapes are typically provided in the form of sheets or rolls of sheets. For example, sheets of copper-on-polyimide are commonly used for fine-line and high-density electronic interconnection applications. Polyimide base films offer good thermal and chemical stability and a low dielectric constant. Copper having high tensile strength, ductility, and flexure have been advantageously used in both flexible circuit and chip scale packaging applications. In particular, medical, hard disk drive, and other applications often require line and space features 50 micrometers and finer. Sheets of copper of a small grain size on polyimide are particularly suited for such applications.

In addition, adhesiveless copper-on-polyimide sheets are now widely used in the production of flexible circuits, rigid-flex boards, chip scale packages and other electronic connection products. A typical sheet is constructed from a polyimide base film, a thin metal tiecoat, a seedcoat, and a layer of copper electrodeposited on the seedcoat. For example, continuous vacuum techniques may be used to deposit the tiecoat and seedcoat, successively, and roll-to-roll electrodeposition methods may build up the copper layer. The elimination of the adhesive layer substantially reduces weight and thickness, offering advantages in portable applications.

When a polyimide base film is provided having opposing major surfaces, one or both major surfaces may have conductive regions thereon. Generally, a single-sided sheet, i.e., a sheet formed from a polyimide base film having conductive regions on only a single major surface, is significantly less expensive than a double-sided sheet having conductive regions on both major surfaces. Double-sided sheets, however, may be needed when a single-sided sheet does not have sufficient surface area to contain the conductive regions needed for an intended application.

Often, sheets are stacked to produce multilayer wiring circuit boards. For example, U.S. Pat. Nos. 6,528,874 and 6,646,337, each to Iijima et al., describe methods for producing wiring boards for mounting electronic devices, such as integrated circuits (ICs) and large scale integrated circuits (LSI circuits). The wiring substrates are formed by selectively etching a copper foil laminate so as to form layers having posts of uniform height. The layers may be stacked to form wiring circuit boards. U.S. Pat. Nos. 6,372,620 and 6,617,236, each to Oosawa et al., describe methods similar to those methods described in the Iijima et al. patents for producing wiring boards. The Oosawa et al. methods, however, involve using the use of additive rather than subtractive processes to form the layers.

In addition, U.S. Patent Application Publication No. 20020140076 to Yamazaki et al. describes a compact multilayer wiring circuit board. The board includes first and second wiring circuit boards. The first board is made of a laminate of conductive and insulating layers. The second wiring circuit board includes at least one conductive layer and is laminated on a partial region of the first wiring circuit board. Only one insulating layer is interposed between an outermost conductive layer of the first wiring circuit board and the nearest conductive layer of the second wiring circuit board to the outermost conductive layer. Generally, the board may be produced by providing first and second laminates, each having conductive and insulating layers. The conductive surface layer of the first laminate is laminated on the insulating surface layer of the second laminate, and a partial region of the conductive layer of the second laminate is removed to expose the insulating surface layer thereof.

In order to connect the conductive regions of different layers of multilayer wiring circuit boards, one or more vias are typically formed through drilling or similar techniques. Via formation, however, can contribute significantly to the cost of circuit boards. In contrast, wire bonding and lead bonding techniques are, as a general matter, relatively inexpensive compared to via formation techniques.

Thus, there exist opportunities in the art to provide alternatives and improvements to substrate technologies for microelectronic device packaging application, particularly those technologies compatible with wire bonding and lead bonding techniques and those technologies that do not require formation of vias.

SUMMARY OF THE INVENTION

One aspect of the invention provides a substrate for packaging a microelectronic device. The substrate is formed from a plurality of sheets. At least first and second sheets are employed, wherein each sheet has opposing first and second major surfaces, and each first surface contains a plurality of electrically conductive regions. The sheets are arranged such that the second major surface of the first sheet faces the first major surface of the second sheet. At least one electrically conductive region or a portion thereof for each sheet is exposed, and at least one electrically conductive region of the first major surface of the second sheet is covered, e.g., partially or fully by at least one electrically conductive region of the first major surface of the first sheet. For example, the first sheet may contain a window extending through its major surfaces and overlying an exposed electrically conductive region of the second substrate.

Typically, the first and second sheets are polymeric and the electrically conductive regions are metallic. For example, the sheets may be comprised of polyimide, and the electrically conductive regions may be comprised of gold, copper, silver, nickel, tin, chromium, iron, alloys thereof, or combinations of any of the foregoing.

The substrate may include three or more sheets. Single-sided or double-sided sheets may be used. When the second major surface of the first sheet contains a plurality of electrically conductive regions, a dielectric layer, polymeric or otherwise, may be interposed between the first and second sheets.

The first and second sheets may be movable relative to each other. Movability between the sheets may provide substantial fatigue relief over a temperature range of interest. In the alternative, the first and second sheets may be substantially immobilized relative to each other.

An electrically conductive region of the first sheet may be electrically connected to one or more electrically conductive regions of the second sheet. When a window is present in the first sheet, electrical connection between the conductive regions of the sheets may be established through the window. In some instances, two or more electrically conductive regions of the first layer are electrically connected the same electrically conductive region of the second layer.

The invention also provides a reel comprising of a plurality of substrates as described above in the form of a continuous roll.

A further aspect of the invention relates to a method for producing a substrate for packaging a microelectronic device. The method involves providing first and second sheets, wherein each sheet has opposing first and second major surfaces and each first surface contains a plurality of electrically conductive regions. The sheets are arranged such that the second major surface of the first sheet faces the first major surface of the second sheet, and at least one electrically conductive region of each sheet is exposed. In addition, at least one electrically conductive region of the first major surface of the second sheet is partially or fully covered by at least one electrically conductive region of the first major surface of the first sheet.

Often, at least one sheet is formed by providing an electrically conductive layer overlying a dielectric layer, and selectively removing material from the electrically conductive layer. As a result portions of the dielectric layer are exposed, and a plurality of electrically conductive regions are formed that are separated by the exposed portions of the dielectric layer.

In some instances, the electrically conductive layer is laminated on the dielectric layer. In addition or in alternative, the electrically conductive layer may be formed by depositing electrically conductive material in situ on the dielectric layer. For example, vapor deposition or electrochemical plating techniques may be used to effect in situ deposition.

DETAILED DESCRIPTION

Figure 1A:
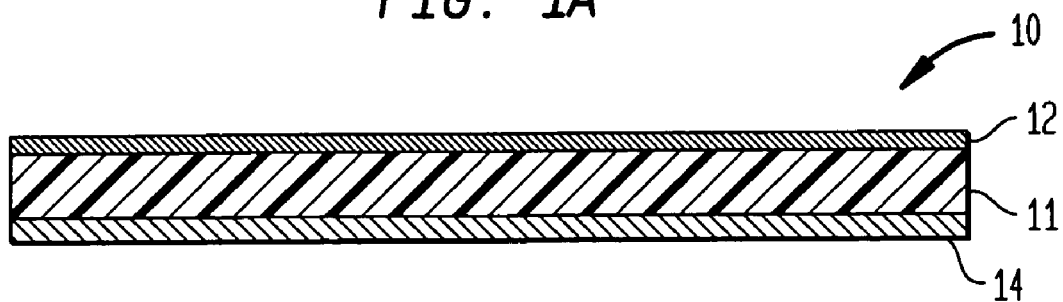
FIGS. 1A-1F, collectively referred to as FIG. 1, illustrate in cross-sectional view a known method for producing a multilayer substrate from a double-sided sheet of a polyimide base film having opposing major surface clad in copper layers.
Figure 1B:
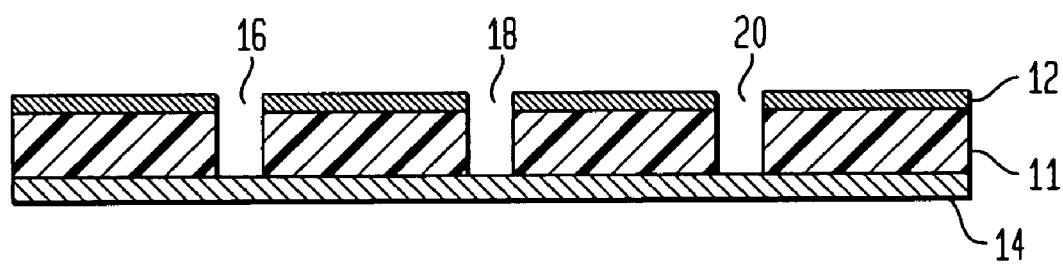

Before describing the present invention in detail, it is to be understood that the invention is not limited to specific microelectronic devices or types of electronic products, as such may vary. It is also to be understood that the terminology used herein is for the purpose of describing particular embodiments only, and is not intended to be limiting.

As used in this specification and the appended claims, the singular article forms "a," "an," and "the" include both singular and plural referents unless the context clearly dictates otherwise. Thus, for example, reference to "a sheet" includes a plurality of posts as well as a single post, reference to "a window" includes an array of windows as well as a single window, reference to "a material" includes a single material as well as a combination of materials, and the like.

Certain embodiments of the invention provide substrates for packaging microelectronic devices and to methods for forming such substrates. The inventive substrates and methods may provide low-cost alternatives to known substrates and methods. In addition, the invention may be used to provide greater functionality to substrates formed from single-sided and/or double-sided metal-clad sheets.

The substrate desirably includes a plurality of sheets. Each sheet has a first major surface containing a plurality of electrically conductive regions and a second major surface that opposes the first major surface. The sheets are arranged such that the first major surface of a sheet faces the second major surface of another. At least one electrically conductive region of each sheet is partially or fully exposed. At least one electrically conductive region of a sheet is partially or fully covered, e.g., by one or more electrically conductive regions of another sheet.

The inventive method according to other aspects of the invention desirably also uses a plurality of sheets, e.g., first and second sheets. Typically, unitary first and second sheets are provided, wherein each sheet has opposing first and second major surfaces, and each first surface contains a plurality of electrically conductive regions. The first and second sheets are arranged such that the second major surface of the first sheet faces the first major surface of the second sheet, and at least one electrically conductive region of each sheet is partially or fully exposed. Furthermore, at least one electrically conductive region of the first major surface of the second sheet is partially or fully covered, e.g., by at least one electrically conductive region of the first major surface of the first sheet.

A prior art method for producing a substrate for microelectronic device packaging and disadvantages associated therewith is shown in FIG. 1. FIG. 1 depicts a method in which a substrate is formed having two-metal blind via structure. As with all figures referenced herein, in which like parts are referenced by like numerals, FIG. 1 is not to scale, and certain dimensions may be exaggerated for clarity of presentation. In FIG. 1A, a double-sided copper-clad sheet 10 in the form of a two-metal tape is shown comprising a polyimide base film 11 clad in copper foils 12, 14. As depicted in FIG. 1B, blind vias 16, 18, 20 are then formed extending through foil 12 and film 11 but terminating at foil 14. Such vias may be formed through the use of a $CO_2$ laser or through other techniques known in the art.

Figure 1C:
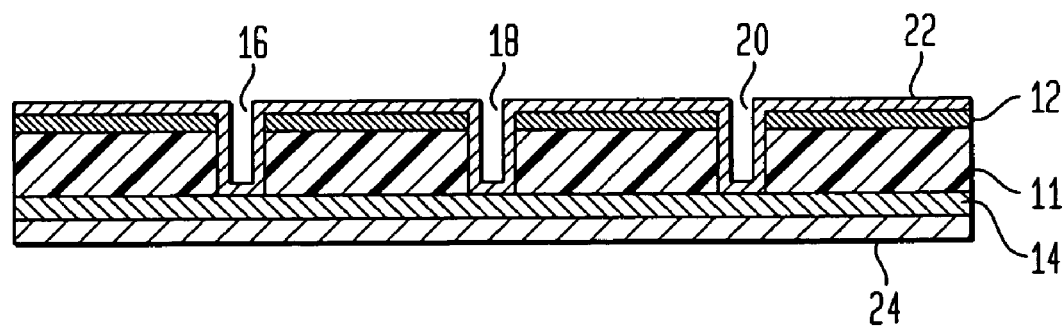
Figure 1D:
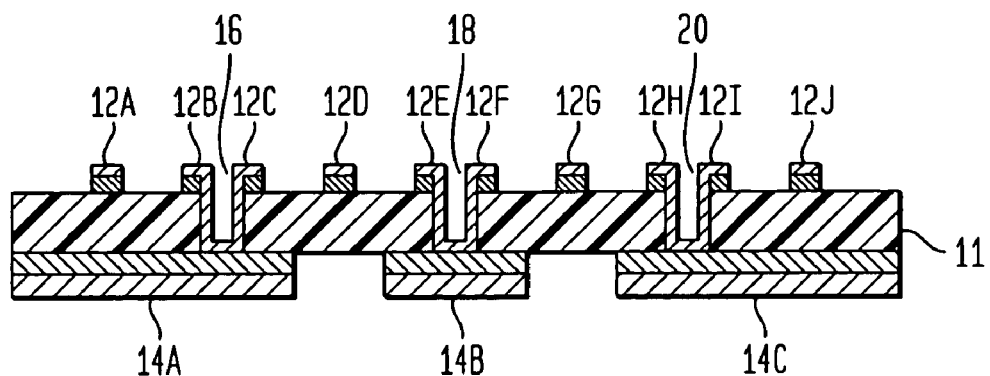
Figure 1E:
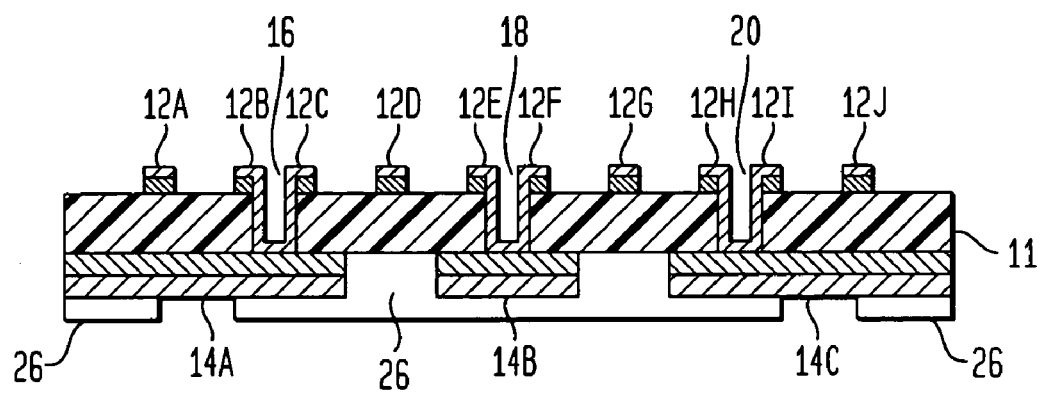
Figure 1F:
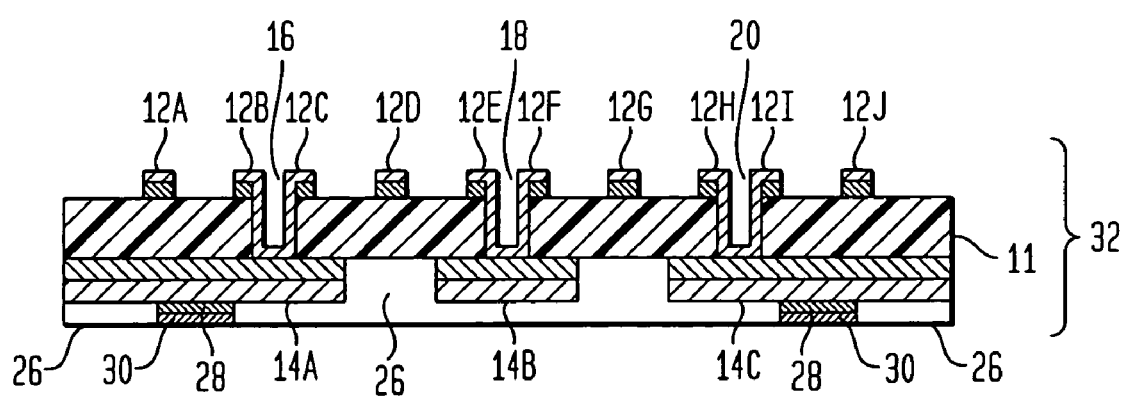

In FIG. 1C, additional copper layers 22, 24 are plated on the exposed surfaces of copper foils 12, 14 and on the luminal surfaces of vias 16, 18, 20. As a result, copper layers 22, 24 are electrically connected. In FIG. 1D, selected regions of each of copper foils 12, 14 are removed, leaving a plurality of conductive regions 12A-12J, 14A-14C behind. In FIG. 1E, solder resist 26 is placed on selected portions of conductive regions 14A-14C. Then, as shown in FIG. 1F, nickel 28 and gold 30 are successively is plated onto the exposed portions of the conductive regions, thereby forming substrate 32.

While the substrate depicted in FIG. 1 may be used in a number of microelectronic device packaging applications, the substrate and the method used to form the substrate are typically high in cost. One factor that contributes to the high cost is the formation of vias. In addition, because a defect in either side of a double-sided sheet may render the entire sheet defective, production yields of double-sided sheets tend to be less than the yield of two single-sided sheets. To boost the yields of double-sided sheets, increased costs are generally required to enhance level of quality control associated with the production of double-sided sheets.

Figure 2:
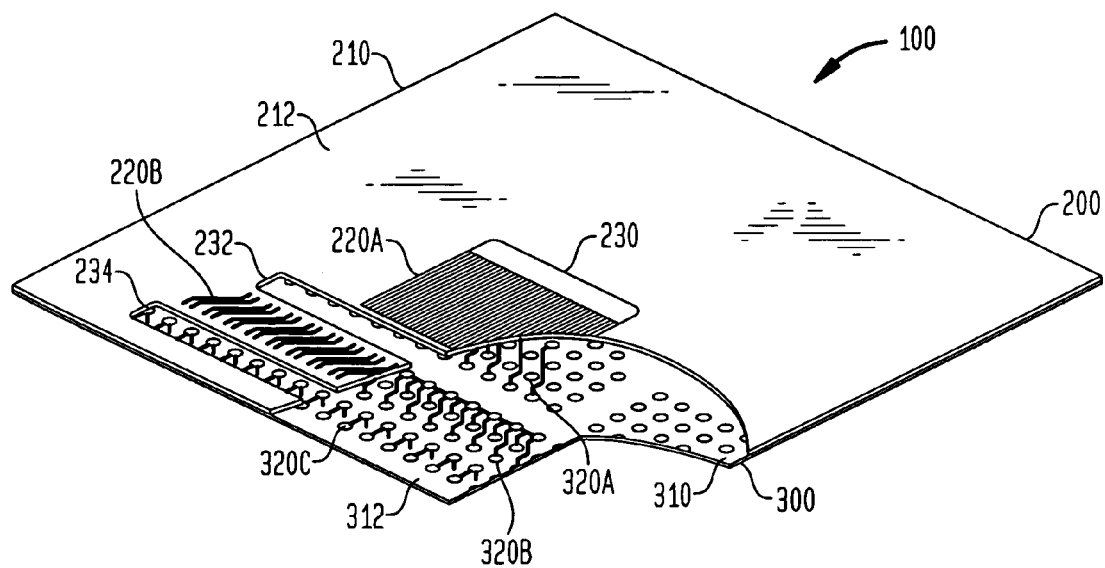
FIG. 2 depicts in perspective cutout view an exemplary substrate of the invention formed from two single-sided sheets.

FIG. 2 depicts an exemplary substrate of the invention. As shown, the via-free substrate 100 is formed from first and second single-sided sheets 200, 300. The first sheet 200 includes a base film 210 comprised of an electrically insulating material. The base film 210 has substantially parallel opposing major surfaces. A plurality of electrically conductive regions 220A, 220B are provided on major surface 212. Electrically conductive regions 220A are provided as substantially parallel and linear metallic traces, and electrically conductive regions 220B are provided as nonlinear traces. The conductive regions 220A, 220B are separated by non-conductive regions of major surface 212. Also provided through the first sheet 200 are first, second, and third windows 230, 232, 234 that extend through the base film 200. As depicted, windows 230, 232, 234 each has a generally rectangular shape having rounded corners, but neither rectangularity nor rounded corners is required for the invention. As discussed below, when windows are present, their shape and placement are generally chosen for selected exposure of particular sections of sheet 300.

Similarly, the second sheet 300 is comprised of a base film 310 having substantially parallel opposing major surfaces. A plurality of electrically conductive regions 320A, 320B, 320C is located on major surface 312. Conductive regions 320A are arranged as a first rectilinear array of features, each having a generally circular region and a tail portion extending generally from the circular region toward an edge of sheet 300. The termini of the tail portions of regions 320A are depicted in a colinear arrangement. Conductive regions 320B are arranged as a second rectilinear array of features, each having a generally circular region and a tail portion extending from the circular region toward the center of sheet 300, wherein the termini of the tail portions are colinear relative to each other. Similarly, conductive regions 320C are arranged as a third array of features. Each feature of the third array also has a generally circular region and a tail portion. Optionally, as shown in FIG. 2, the termini of the tail portions of regions 320A and of regions 320B lie along parallel coextensive lines.

Sheet 200 is positioned over sheet 300 and optionally bonded thereto using an adhesive (not shown). As shown in FIG. 2, conductive regions 220A, 220B are exposed for electrical connection thereto, and the major surface of sheet 200 that opposes 212 faces surface 312 of sheet 300. As a result, the portion of base film 210 containing regions 220A of sheet 200 overlie and conductive regions 320A of sheet 300. Similarly, the portion of base film 210 that contains conductive regions 220B of sheet 200 overlies conductive regions 320B of sheet 300. Due to the geometry and placement of regions 220A of sheet 200 and regions 320A of sheet 300, however, regions 220A only partially cover regions 320A. Similarly, regions 220B of sheet 200 only partially cover regions 320B of sheet 300.

The windows 230, 232, and 234 of sheet 200 is arranged to expose selected sections of sheet 300. As shown in FIG. 2, window 230 is generally depicted as overlying generally the center of sheet 300 and serves to expose the conductive regions sheet 300, optionally for electrical connection thereto. The termini of the tail portions of regions 320A and 320B are exposed through window 232. Conductive regions 320C are also provided as an array having at least portions thereof that remain exposed through window 234.

Figure 3:
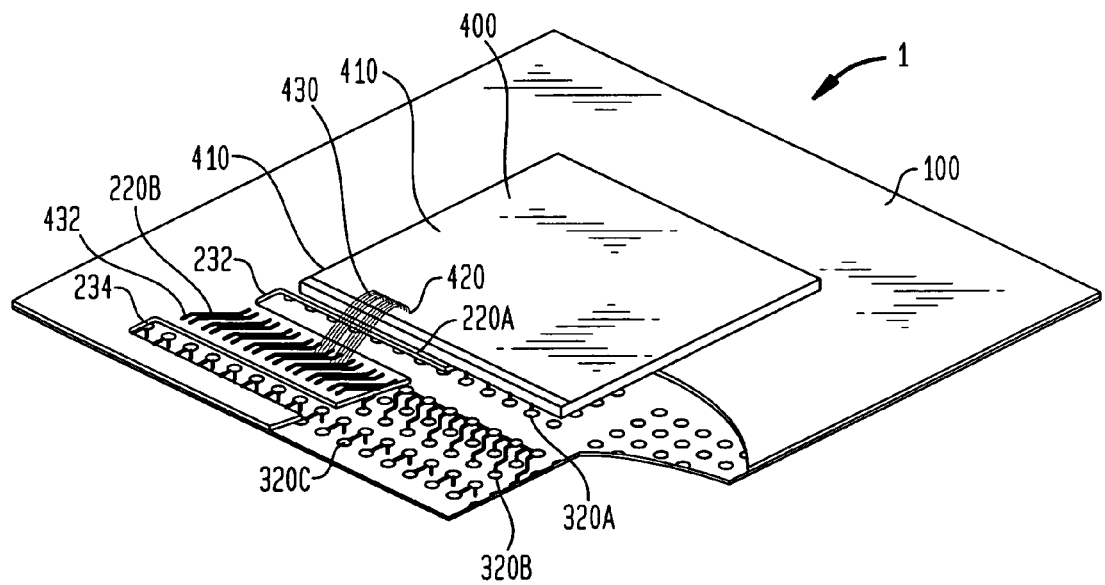
FIG. 3 depicts in perspective cutout view the substrate shown in FIG. 2 with a microelectronic device in the form of a semiconductor chip mechanically and electrically attached to the substrate.

As shown in FIG. 3, the substrate 100 may be used with a microelectronic device such as a semiconductor chip 400 to form a package 1. For example, chip 400 may be provided having a major surface 410 containing a plurality of contacts 420 thereon. When placed in a "face-up" orientation over the center of substrate 100, the contacts 420 are exposed for bonding. As depicted, chip contacts 420 are bonded to regions 220A, 320A, 220B, 320B, via wires 430 respectively. Since regions 320B, 320C are located on sheet 300, wires connecting contacts 420 thereto extend through window 232. In addition, conductive regions 220B may be wire bonded to regions 320C via wires 432 that extend through window 234.

Optionally (not shown), the chip may be placed "face-down" or have one or more contacts on a major surface opposing major surface 420. In such a case, the contacts may be bonded to the conductive regions of sheet 300 exposed through window 230. Thus, it should be evident that the inventive substrate allows for both face-up and face-down orientation for microelectronic device packaging.

Figure 4:
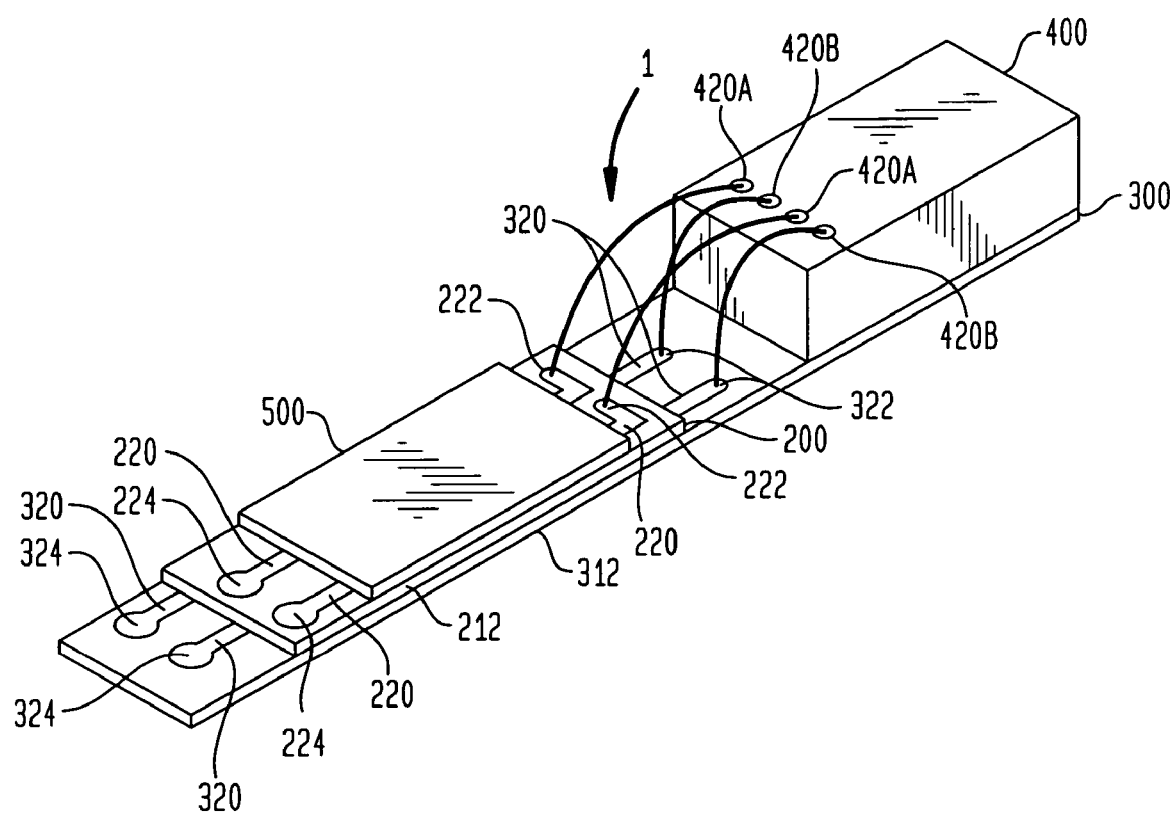
FIG. 4 depicts another exemplary package of the invention.

FIG. 4 depicts another exemplary package of the invention. The package 1 is formed from a semiconductor chip 400 having a plurality of contacts 420A, 420B on a surface thereof and a substrate 100 that serves as a structure for redistributing the electrical paths to the closely-spaced contacts 420A, 420B of the chip 400. Like the substrate of FIG. 1, the substrate of FIG. 4 is formed from first, second single-sided sheets 200, 300, wherein each sheet is comprised of a base film 210, 310 having electrically conductive regions 220, 320 on a major surface 212, 312 thereof. The first sheet 200 has the same width as the second sheet 300, but the second sheet 300 has a greater length than the first sheet 200. Conductive regions 220, 320 coextend in a parallel and generally linear manner from first termini 222, 322 to second termini 224, 324 along the length of sheets 200, 300, respectively.

FIG. 4 further shows that chip 400 is bonded "face-up" to a section of surface 310 that contains no electrically conductive region. In addition, the first sheet 200 is bonded over the second sheet 300 using an adhesive layer (not shown). As a result, sheet 200 covers all of conductive regions 320 except for their termini 322, 324. Notably, regions 220 overlie and partially cover regions 320. Optionally, a third sheet 500 is placed over the first sheet 200 so as to cover all of conductive regions 220 except of their termini 222, 224. Accordingly, termini 222, 224, 322, 324 are exposed while the remaining portions of conductive regions 220 and 320 are covered.

To redistribute the closely-spaced contacts 420A, 420B of the chip 400, chip contacts 420A are wire bonded to termini 222, and chip contacts 420B are wire bonded to chip termini 322. As a result, termini 224 may serve as pads for electrical connection to contacts 420A, and termini 324 may serve as pads for electrical connection to contacts 420B. When the substrate 100 is flexible, the pads 224, 324 are moveable relative chip contacts 420A, 420B. Thus, it should be apparent that the substrate may have a shape such that pads 224, 324 are disposed at an acute, right or obtuse angle relative chip contacts 420A, 420B. In addition, the substrate 100 may be bent such that the pads 224, 324 may face or oppose chip.

As discussed above, the invention typically involves a plurality of sheets. The sheets are typically each comprised of a base film of a dielectric material. The dielectric material may be selected according to its functionality. In addition, depending on the material used and the handling requirements, the base film may be flexible, semi-flexible or substantially rigid. For example, when high rigidity, hardness, and/or high temperature dimensional stability is required, the dielectric material may be comprised of a ceramic material. Exemplary ceramic materials include single or mixed metal oxides such as aluminum or silicon oxides, nitrides, and carbides.

However, when flexibility is desired, polymeric materials may be used as the dielectric material. Base polymeric films may be substantially inextensible. Polyimide, for example, is a high performance polymer that has a number of desirable properties for advanced electronic applications. Polyimide films have a high degree of thermal stability, permitting them to withstand processing at elevated temperatures. They have low shrinkage, reasonably high strength and modulus. This enhances handling during processing, especially for very thin materials. The dielectric constant for polyimide is as low as 3.2. They also have low dissipation factor and good dielectric strength.

Polyimides are chemically stable, and withstand harsh chemical environments associated with circuit board processing. At the same time, certain polyimides are chemically etchable in hot potassium hydroxide, and all commercially available polyimides are laser ablatable. Polyimides are also available to address specific application requirements. Suppliers of polyimide base film include: E.I. DuPont de Nemours & Co., Ube Industries, Ltd., and Kaneka Corporation.

Other polymeric materials include, but are not limited to, polyesters such as polyethylene terephthalate and polyethylene naphthalate, polyalkanes such as polyethylene, polypropylene and polybutylene, halogenated polymers such as partially and fully fluorinated polyalkanes and partially and fully chlorinated polyalkanes, polycarbonate, epoxies, and polysiloxanes. Substrates formed from such films may be provided as a reel in the form of a continuous roll.

In some instances, the dielectric material may be formed from a combination of polymeric and ceramic materials. For example, fiberglass laminates may serve as the base film. Other composite materials may be used as well. In any case, the base films of different sheets may be comprised of the same or different materials.

Sheet and/or film thickness may vary. In general, the thickness requirements for the base film depends on the strength of the material as well as the stresses imposed on the substrate. Bare polymeric films having a thickness of about 5 μm to about 500 μm, for example, may be used for reel-to-reel web processes. In some instances, polymeric films may have a thickness on the order of about 20 μm to about 100 μm. In particular, polyimide films are commercially available 12.5 μm to 125 μm, although 25 μm and 50 μm films are most common In addition, each sheet generally has at least one major surface that contains electrically conductive regions. Such regions are comprised of an electrically conductive material. Typically, the regions are made from one or more metals. For example, a conductive region may be comprised of solid copper or a composite composition containing copper particles. Additional metals suitable for use in the invention include, for example, gold, silver, nickel, tin, chromium, iron, aluminum, zinc, combinations thereof, and alloys of any of the foregoing such as brass, bronze, and steel. Typically, small-grained metals are preferred for greater feature resolution.

In addition or in the alternative, a nonmetallic conductive material may be used to form the conductive regions. Exemplary nonmetallic conductive materials include carbon, e.g., graphite or acetylene black, conductive ceramics such as indium tin oxide and titanium nitride, and conductive polymers such as polypyrrole and polyaniline. Furthermore, a conductive region may have a surface layer of a composition different from its bulk. For example, the surface layer may be comprised of a highly conductive coating such as gold, gold/nickel, gold/osmium or gold/palladium, or plated with a wear resistant, coating such as osmium, chromium or titanium nitride. In any case, the conductive regions of the inventive substrate may be comprised of the same material or different materials. Nevertheless, conductive regions on different surfaces are more likely comprised of different materials than conductive regions on the same surface.

The substrate may include three or more sheets. Single-sided or double-sided sheets may be used, and various combinations of sheets may be used. For example, the pattern of conductive regions on different sheets or different surfaces of the same sheet may be the same or different. In addition, at least one sheet typically contains a window that provides electrical access therethrough. For example, when a first sheet is provided over a second sheet, the first sheet may contain a window that overlies at least one partially or fully exposed electrically conductive region of the second substrate. The window may have a shape that corresponds to the pattern of desired exposure for conductive regions of the underlying the sheet. Additional windows of the same or a different size and/or shape may be provided as well.

Electrical connections may be established in different ways. When a plurality of sheets is provided, at least one electrically conductive region of one or more sheets may be electrically connected, e.g., wire bonded or lead bonded, to at least one electrically conductive regions of one or more different sheets, optionally through one or more windows in any of the sheets. In some instances, at least two electrically conductive regions of the same sheet are electrically connected the same electrically conductive region of another sheet. Optionally, no conductive via extends through any sheet. Similarly, a microelectronic device may have a plurality of electrical contacts electrically connected, e.g., wire-bonded or lead-bonded, to at least one electrically conductive region of the inventive substrate.

Often, a dielectric layer may be interposed between two sheets. Such dielectric layers may serve different purposes. For example, when the facing major surfaces of two sheets each contains one or more electrically conductive regions, the dielectric layer may serve to maintain electrical isolation between the regions of the sheets. In addition, an interposing dielectric layer may serve to immobilize the sheets relative to each other, thereby forming a laminate structure. In some instances, a substantially solid dielectric film may be used. However, the interposing layer may be formed in situ. For example, a curable liquid may be injected between the substrates and subjected curing conditions to form a polymer layer between substrates In any case, the interposing dielectric layer formed by subjecting a dielectric material interposed between the sheets to bonding conditions, thereby forming a laminate structure. For example, pressure may be applied to a polymeric material between sheets for bonding. As another example, solvent may be removed from an adhesive solution by subjecting the solution to heat and/or vacuum.

Nevertheless, the sheets of the inventive substrate may be movable relative to each other. Movability between the sheets is often desirable when the sheets of the same substrate have different coefficients of thermal expansion (CTE). When sheets of mismatched CTE are immobilized relative to one other to form a substrate, the substrate will tend to deform according to its exposure to a varying range of temperatures because the sheets will expand and/or contract at different rates In addition, any rigid electrical path between such sheets will undergo repeated stress or fatigue when the substrate is cycled over a temperature range. Movable sheets, on the other hand, may provide substantial fatigue relief over a temperature range of interest. Notably, stresses due to mismatched CTE tend to become greater over a greater temperature range. Thus, in some instances, substantial fatigue relief may be provided over a temperature range of at least about 50° C. or at least about 100° C.

It should be noted that the phrase "substantial" as used to describe the term "fatigue relief," refers, among other things, to the increase in the average number of cycles for an electrical path to failure by at least two-fold. Preferably, the average number of cycle to failure is increased by ten-fold. Thus, for example, when the inventive substrate having movable sheets is evaluated against another substrate in a thermal cycling context, the average cycles to failure for the inventive substrate may be at least a two-fold or ten-fold greater than that for the other due to "substantial fatigue relief" provided by the movability between the sheets. Similarly, the terms "substantial" and "substantially" are used analogously in other contexts involve an analogous definition.

The substrate may be produced by any of a number of ways. Typically, first and second sheets are provided, wherein each sheet has opposing first and second major surfaces and each first surface contains a plurality of electrically conductive regions. The sheets are arranged such that the second major surface of the first sheet faces the first major surface of the second sheet, and at least one electrically conductive region of each sheet is exposed. In addition, at least one electrically conductive region of the first major surface of the second sheet is partially or fully covered by at one least electrically conductive region of the first major surface of the first sheet.

Additive and/or subtractive processes may be used to form the electrically conductive regions. In additive processes, a dielectric layer may be provided. Through selective patternwise deposition of electrically conductive regions on a surface of the dielectric layer, a sheet of the invention may be formed. Optionally, lithographic techniques may be used to effect patternwise deposition. For example, photolithographic masking techniques may be to effect patternwise vapor deposition of a metallic layer on the surface of the dielectric layer.

For subtractive processes, precursor sheets may be used comprising a contiguous electrically conductive layer overlying a dielectric layer. For example, at least one sheet may be formed by providing precursor sheet and selectively removing material from the electrically conductive layer. As a result, portions of the dielectric layer are exposed, to form a plurality of electrically conductive regions separated by the exposed portions of the dielectric layer.

Precursor sheets may be produced though different techniques. For example, precursor sheets may be prepared by laminating a metal foil to a base film using an adhesive. This approach is often used for conventional flex circuit and TAB applications. However, this approach tends to increase the thickness and weight of substrate. In addition, the use of an adhesive introduces thermal stability and other issues with the adhesive itself. Furthermore, this approach may be limited by the minimum foil thickness availability for commercial foils. Thus, the adhesive may be omitted. Instead, one or more metallization layers may be deposited on the base film. A vacuum technique, such as sputter deposition, is a common method for direct metallization to form thin and lightweight adhesiveless sheets. Such sheets facilitate fine-line feature formation.

Commercially available adhesiveless copper on polyimide precursor sheets are particularly useful. Polyimide has a coefficient of thermal expansion (CTE) that is fairly close to copper over a fairly wide temperature range and, mechanical stresses induced in copper during thermal excursions are minimized. Such precursor sheets typically include the polyimide base film, a thin metal tiecoat, a copper seedcoat, and a layer of electrodeposited copper. They can have single or double-sided metallization, and are often provided in roll format to streamline subsequent processing. Often, two roll-to-roll manufacturing processes are be used to apply the metallization layers for such sheets.

In an exemplary process, a tiecoat layer is applied using vacuum deposition techniques. The process begins with a plasma pretreatment of the polyimide. The pretreatment cleans and chemically modifies the surface to enhance adhesion. The tiecoat serves to enhance adhesion, particular after materials are exposed to severe processing or environmental conditions, e.g., during selective removal of the conductive regions. Exemplary tiecoat metal includes chromium and nickel based alloys such as monel. The tiecoat can be as thick as several hundreds of angstroms, and as thin as a few angstroms. Chromium has advantages in that it provides superior adhesion performance. However, monel also has fewer environmental concerns than chromium.

Then, a seedcoat having sufficient electrical conductivity to permit electroplating to final thickness is deposited, e.g., through sputtering or evaporation, on the tie coat. Typically, the seedcoat is comprised of the same metal used to form the conductive metallic layer. Thus, when the conductive metallic layer comprises or consists essentially of copper, the seedcoat metals may comprise or consist essentially of copper.

Once the seedcoat is deposited, additional metal, e.g., copper may be electrodeposited thereon. Electrodeposition is a highly versatile and relatively inexpensive process that allows control over copper thickness. Copper on either side of the substrate can differ in thickness. In some instances, electrodeposited copper on the laminate can be eliminated altogether, and only the ultra-thin, vacuum deposited copper is provided.

Once the precursor sheet is formed, the conductive metallic layer may be selectively removed through etching in a desired pattern to form the conductive regions of the invention. Thin metallic layers, in particular, facilitates the formation of very conductive regions of high resolution, e.g., fine lines. In addition, the smooth interface between conductive layer and the dielectric layer facilitates fine-line feature formation. Lines having a width of approximately 25 may be etched using adhesiveless copper on polyimide substrates.

Different etching processes may be needed depending on the composition of the precursor film. For example, when chromium is present as a tiecoat in the precursor film, etchants such as potassium permanganate is required to remove the tiecoat. Thus, precursor films having copper on chromium often require a plurality of etch steps. That is, one or more etch steps may be needed for removal of each layer of copper and chromium. Monel, in contrast, is etchable in industry standard etchants such as cupric chloride. As a result, patterning or circuitization can be accomplished in a single etch process, e.g., without the use of permanganate etchants.

Thus, in its preferred forms, the invention provides a number of advantages over substrates and methods for forming substrates known in the art. For example, a substrate may be formed from two single-sided sheets to provide substantially the same functionality as a substrate formed from one double-sided sheet having conductive regions on both major surfaces. However, substrates formed from single-sided sheets will tend to be significantly less expensive than the substrate formed from double-sided sheets. One of ordinary skill in the art will recognize that the same or similar cost savings may be achieve through substrates having more than two sheets when at least one sheet is single-sided. In addition, greater functionality may be provided when double-sided sheets are used in the context of the invention.

In particular, the invention is well suited for packaging microelectronic devices having a large number of input and output connections in the context of mass-produced, portable electronic products. For example, the invention may be used to package microelectronic devices for acoustic and optical applications, such as those used in camera phones. See, e.g., U.S. patent application Ser. No. 10/949,674, filed Sep. 24, 2004, entitled "Structure and Method of Making Capped Chips Having Vertical Interconnects," inventors Humpston, Tuckerman, McWilliams, Haba, and Mitchell. The low cost nature of the invention is particularly advantageous in single use or disposable applications. In addition, the invention may be advantageously used in portable products that employ memory devices of an optical, electrical, magnetic and/or mechanical nature. Such memory devices may employ random and/or serial access memory.

Variations of the present invention will be apparent to those of ordinary skill in the art. For example, the inventive substrate may be formed using cutting-edge sheets such as those described in U.S. patent application Ser. No. 10/917, 978, filed Aug. 13, 2004, entitled "Connection Structures of Microelectronic Devices and Methods for Forming Such Structures," inventors Haba, Beroz, Tuckerman, Humpston, and Crisp, as well as currently commercially available single-sided and double-sided sheets. In addition, the inventive method may employ photoresist technologies known in the art provide selective masking when additive or subtractive processes are used to form the conductive regions of the inventive connection structure. Furthermore, alignment means known in the art, e.g., mating features, optical guides, devices used in metrology, etc., may be used to facilitate proper positioning of the sheets relative to each other during batch or continuous processes associated with the invention. Other variations of the invention may be discovered upon routine experimentation without departing from the spirit of the present invention.

Although the invention herein has been described with reference to particular embodiments, it is to be understood that these embodiments are merely illustrative of the principles and applications of the present invention. It is, therefore, to be understood that numerous modifications may be made to the illustrative embodiments and that other arrangements may be devised without departing from the spirit and scope of the present invention as defined by the appended claims.

All patents, patent applications and publications mentioned herein are hereby incorporated by reference in their entireties.

The invention claimed is:

1. A substrate for packaging a microelectronic device, said substrate comprising:

first and second sheets each having opposing first and second major surfaces, each one of the first major surfaces having an associated plurality of electrically conductive regions, the second major surface of at least one of the first and second sheets having no electrically conductive region, the first and second sheets being arranged such that the second major surface of the first sheet faces the first major surface of the second sheet, at least one electrically conductive region of each one of the first and second sheets being partially or fully exposed, and at least one electrically conductive region of the first major surface of the second sheet being partially or fully covered by at least one electrically conductive region of the first major surface of the first sheet.

2. The substrate of claim 1, wherein the first sheet includes a window extending through the major surfaces thereof and overlying the at least one partially or fully exposed electrically conductive region of the second sheet.

3. The substrate of claim 2, wherein at least one electrically conductive region of the first sheet is electrically connected to at least one electrically conductive region of the second sheet through the window of the first sheet.

4. The substrate of claim 1, wherein the electrically conductive surface regions of the first sheet are separated by at least one polymeric region.

5. The substrate of claim 4, wherein the polymeric region is comprised of polyimide.

6. The substrate of claim 1, wherein the electrically conductive surface regions are metallic.

7. The substrate of claim 6, wherein the metallic surface regions are comprised of one or more of gold, copper, silver, nickel, tin, chromium, iron, alloys thereof, or combinations of any of the foregoing.

8. The substrate of claim 1, wherein the second major surface of another one of the first and second sheets has no electrically conductive regions.

9. The substrate of claim 8, further comprising a dielectric layer interposed between the first and second sheets.

10. The substrate of claim 9, wherein the dielectric layer is comprised of a polymer.

11. The substrate of claim 1, wherein the first and second sheets are movable relative to each other.

12. The substrate of claim 11, wherein the first and second sheets are movable relative to each other to a substantial fatigue-relieving degree.

13. The substrate of claim 1, wherein the first and second sheets are substantially immobilized relative to each other.

14. The substrate of claim 1, further comprising a third sheet having a surface that includes a plurality of electrically conductive regions.

15. The substrate of claim 1, wherein at least one electrically conductive region of the first sheet is electrically connected to at least one electrically conductive region of the second sheet.

16. The substrate of claim 15, wherein the at least one electrically conductive region of the first sheet is wire bonded to the at least one electrically conductive region of the second sheet.

17. The substrate of claim 15, wherein the at least one electrically conductive region of the first sheet is lead bonded to the at least one electrically conductive region of the second sheet.

18. The substrate of claim 1, wherein at least two electrically conductive regions of the first sheet are electrically connected to the same electrically conductive region of the second sheet.

19. The substrate of claim 1, wherein at least two electrically conductive regions of the second sheet are electrically connected to the same electrically conductive region of the first sheet.

20. The substrate of claim 1, having no conductive via extending perpendicularly through the first and second major surfaces of the first sheet.

21. A microelectronic package, comprising a microelectronic device having a plurality of electrical contacts bonded to at least one electrically conductive region of the substrate of claim 1.

22. The microelectronic device of claim 21, wherein the electrical contacts are wire bonded to the at least one electrically conductive region.

23. The microelectronic device of claim 21, wherein the electrical contacts are lead bonded to the at least one electrically conductive region.

24. A reel, comprising a plurality of substrates of claim 1 as a continuous roll.

* * * * *